June 1, 1965 G. L. SCHNABLE 3,186,879

SEMICONDUCTOR DEVICES UTILIZING CADMIUM ALLOY REGIONS

Original Filed July 24, 1959

INVENTOR.
GEORGE L. SCHNABLE
BY
Herbert Epstein
AGENT

United States Patent Office 3,186,879

Patented June 1, 1965

3,186,879

SEMICONDUCTOR DEVICES UTILIZING CADMIUM ALLOY REGIONS

George L. Schnable, Lansdale, Pa., assignor, by mesne assignments, to Philco Corporation, Philadelphia, Pa., a corporation of Delaware Original application July 24, 1959, Ser. No. 829,436. Divided and this application Aug. 28, 1961, Ser. No. 134,352

8 Claims. (Cl. 148—1.5)

This application is a division of my copending application Serial No. 829,436, filed July 24, 1959, entitled "Method of Fabricating Semiconductor Devices Comprising Cadmium-Containing Contacts," now Patent No. 3,005,735.

This invention relates to improved semiconductor devices. More particularly it relates to improved transistors and semi-conductor diodes of the type having rectifying alloy junctions, which can be fabricated, stored or operated at higher temperatures than has heretofore been possible with conventional transistors and diodes.

Heretofore the acceptor metal indium and alloys thereof have been almost universally used as alloying materials in forming the rectifying junctions of alloy- and micro-alloy-junction transistors and diodes comprising n-type or intrinsic germanium bodies. However indium melts at a relatively low temperature (155° C.) and has relatively poor thermal conductivity (0.057 calorie centimeter/second centimeter$^2$ ° C.). Because indium melts at only 155° C. transistors and diodes fabricated with indium cannot be used or stored at temperatures substantially in excess of 100° C. For example, when transistors having indium alloy-junction collectors are operated at collector currents such that the average temperature of the transistor is in the vicinity of 100° C., the temperature of discrete regions of the indium collector frequently rises to values in excess of 155° C. At these "hot spots" the indium melts and proceeds to dissolve the germanium contiguous thereto. As a result the molten indium frequently penetrates the very thin germanium base region of the transistor and short-circuits the collector to the emitter opposing it, thereby destroying the transistor. Moreover, because indium has poor thermal conductivity, the indium-containing electrode removes heat slowly from the rectifying junction at which it is generated. For this reason and because indium melts at only 155° C. the maximum power dissipation at which transistors and diodes fabricated with indium are operated must be relatively low to avoid permanent damage to these devices by overheating.

Furthermore, because indium melts at such a low temperature, it is not practicable adequately to vacuum-bake an indium alloy-junction device during its fabrication, thereby to drive out from its electrodes and semiconductive body undesired contaminants such as occluded gases, salts and solvents used during the fabrication thereof. As a result many such units have only relatively short operating lives, being gradually poisoned by the contaminants still present thereon after baking.

Accordingly it is an object of the invention to provide improved semiconductor devices.

Another object is to provide an improved process for fabricating such devices.

Another object is to provide alloy-junction semiconductor devices such as transistors and diodes operable at temperatures substantially higher than those at which similar devices incorporating indium electrodes are operable.

Another object is to provide alloy-junction semiconductor devices whose rectifier electrodes can dissipate heat at a substantially higher rate than can semiconductor devices employing indium electrodes of the same size.

Another object is to provide an improved process for fabricating alloy-junction transistors and diodes operable and storable at high temperatures.

The foregoing objects are achieved by the provision of a semiconductor device, e.g. a transistor or diode, comprising a body constituted principally of germanium and having two contiguous regions within said body. In accordance with the invention one of these regions is composed of an alloy comprising cadmium and germanium and having a solidus temperature above 155° C. Preferably this alloy consists essentially of germanium and cadmium; germanium, cadmium and tin; germanium, cadmium, tin and gallium; germanium, cadmium, tin and aluminum; germanium, cadmium, tin, aluminum and gallium; germanium, cadmium and gallium; germanium, cadmium and aluminum, or germanium, cadmium, aluminum and gallium. Such alloys have p-type properties and, where the other of said contiguous regions has n-type or intrinsic properties, provide a rectifying junction in the semiconductor device. Devices according to the invention which comprise other suitable germanium-cadmium alloys are described hereinafter.

This novel device is fabricated in accordance with the invention by applying a mass of cadmium or an alloy thereof having a solidus temperature above 155° C., to a surface region of the germanium body, heating this metal mass sufficiently to form a liquid mixture between it and germanium of said body, and cooling the mixture below its solidus temperature thereby to form a recrystallized region in said body. In a form of this novel process especially well suited to the production of extremely thin recrystallized regions, substantially pure cadmium is coated onto said surface region of said germanium body, e.g. by jet electroplating. Next a mass of an alloy which may be composed of tin-gallium, tin-cadmium, tin-aluminum, tin-aluminum-gallium, tin -cadmium-gallium, tin-cadmium-aluminum, or tin-cadmium-aluminum-gallium is applied to the cadmium coating. Typically this alloy mass is a globule of solder coated onto a lead wire to be secured to the portion of the germanium body within which the junction is formed, and is abutted against the cadmium coating. The alloy mass is heated sufficiently to form a liquid mixture between this mass, the cadmium coating and a thin portion of the germanium body therebeneath. This liquid mixture is then cooled to a temperature below its solidus temperature thereby to form in the germanium body an alloy-junction region. By cooling the liquid mixture almost immediately after it forms, a junction is produced just beneath the surface of the semiconductive body, e.g. within about 0.001 mil thereof. As a result the shape of the junction conforms closely to that of the body surface region beneath which it is formed. Moreover where the alloy mass employed contains a small amount of gallium and/or aluminum, the recrystallized region thus formed contains a relatively high concentration of the latter acceptor substance and hence has excellent hole-injecting properties despite its thinness.

Alternatively the junction can be formed by placing a pellet of cadmium onto the surface of a germanium body, heating body and pellet to a temperature sufficiently high for the pellet to alloy with germanium of the body, and cooling the alloy to a temperature below its solidus temperature. Because the cadmium-germanium eutectic melts at 319° C., i.e., 164° C. above the melting point of indium, connections can be made to the cadmium electrode by solders having considerably higher solidus temperatures than those of the solders usable to secure conductors to indium-containing electrodes.

Because cadmium and the solder alloys listed above begin to melt at temperatures substantially above the melting point of indium, semiconductor devices fabricated with them can be vacuum-baked at correspondingly higher temperatures; hence the surface of the germanium body can be rendered freer of contaminants than was heretofore practicable in devices fabricated with indium. Moreover my novel devices can withstand correspondingly higher operating and storage temperatures without undergoing dissolution of portions of their electrodes. Furthermore, because cadmium has a thermal conductivity of about 0.22 calorie centimeter/second centimeter$^2$ ° C., i.e. about four times higher than that of indium, the resultant device can dissipate considerably more heat per unit volume for a given permissible rise in the temperature of its junction that can an indium device. As a result the power dissipation ratings of transistors and diodes fabricated with cadmium alone or one of the above-listed cadmium alloys and of a given size can be considerably higher than those of transistors and diodes of the same size fabricated with indium.

Other advantages and features of the invention will become apparent from a consideration of the following detailed description, taken in connection with the accompanying drawings, in which.

Figure 1:
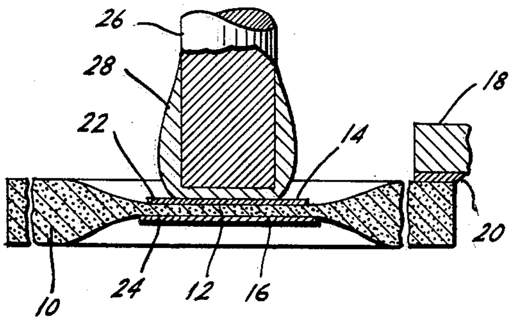
FIGURES 1 to 3 are cross-sectional diagrams of a transistor according to the invention, at various stages in its fabrication.

The partially completed transistor shown in FIGURE 1 comprises a rectangular wafer 10 of n-type germanium typically having a resistivity of about 1 ohm-centimeter, a length of 70 mils, a width of 50 mils and a thickness of 5 mils. Wafer 10 has formed therein a thin base region 12, e.g. by electrolytically jet-etching it in a manner such as to produce opposed coaxial depressions whose respective surfaces 14 and 16 have substantially plane regions parallel to and spaced from one another by a very small distance, e.g., about 0.1 mil. A base electrode 18, which typically is a nickel tab, is secured to one end of wafer 10 by a body of solder 20 producing a substantially ohmic contact, e.g. tin, lead containing about 0.5 percent by weight of arsenic, or lead containing about 2 percent by weight of antimony.

In accordance with the invention, disks 22 and 24 composed of substantially pure cadmium are applied to surfaces 14 and 16 respectively of wafer 10, e.g. by jet electrolytic plating. A suitable plating solution is described hereinafter. Disk 22, beneath which an emitter junction is to be formed, has somewhat smaller diameter than disk 24, beneath which a collector junction is to be formed. Typically disk 22 has a diameter of 4 mils and disk 24 has a diameter of 6 mils.

Next an emitter microalloy junction is formed in the region of wafer 10 beneath disk 22. To form this junction the end of a nickel lead wire 26 having a globule 28 of tin-cadmium-gallium solder electroplated thereon is abutted coaxially against cadmium disk 22. Preferably the cadmium content of globule 28 is between about 15 and about 20 percent by weight, and gallium content is about 1.5 percent by weight. Such a solder begins to melt at about 170° C. A process for electrodepositing globule 28 on wire 26 is described hereinafter. Globule 28 is then melted by heating it radiatively, or conductively by way of wire 26, e.g. to a temperature of about 300° C., thereby to cause globule 28, disk 22 and an extremely thin portion of the semi-conductive body lying beneath disk 22 to form a liquid mixture. Almost immediately after this liquid mixture is formed the heating is discontinued and the mixture cooled below its solidus temperature. As a result of this cooling a recrystallized region 30 which is only about 0.001 mil thick and contains a relatively high concentration of gallium forms within a portion of wafer 10 underlying disk 22. Because of the relatively high concentration of gallium therein region 30 is characterized by excellent hole-injection properties despite its extreme thinness. In addition lead wire 26 is strongly bonded to wafer 10 at region 30 by a solder fillet 32.

Next the collector junction is formed by abutting coaxially against cadmium disk 24 the end of a lead wire 34 having a globule 36 of tin-cadmium solder affixed thereto, by heating globule 36 sufficiently to form a liquid mixture between it, disk 24 and a thin portion of wafer 10 therebeneath, and by cooling this mixture below its solidus temperature. Preferably globule 36 contains about 35 percent by weight of cadmium and is electrodeposited onto wire 34 by a method described hereinafter. By performing these steps a p-type recrystallized region 38 (see FIGURE 3) is formed within wafer 10 and lead wire 34 is bonded thereto by a solder fillet 40. The acceptor substance in this p-type recrystallized region is the cadmium of disk 16 and globule 36.

By employing the foregoing process a transistor assembly is produced which can be subjected to further heat treatment, e.g. vacuum-baking, at temperatures substantially above the melting point of indium, and which can be operated at similarly higher temperatures and with higher power dissipation than can a transistor of the same size which is fabricated with indium.

For jet-electroplating cadmium disks 22 and 24 onto wafer 10, an electrolytic solution composed of the following substances and prepared in the following manner has been found to be particularly satisfactory:

An aqueous solution containing between 49 and 51 percent by weight of cadmium fluoborate and having a density of about 1.6 grams per milliliter, An aqueous solution containing about 15 percent by weight of sodium decylbenzenesulfonate, Deionized water having a minimum specific resistance of 5 megohm-centimeters at 18° C., Aqueous ammonium hydroxide, A.C.S. reagent, electronic grade, containing 28 to 30 percent by weight of $NH_3$ and a maximum of heavy metals (as lead) of 1 part per million, and An aqueous solution containing 48 to 50 percent by weight of fluoboric acid.

In preparing this plating bath, 10 liters of the deionized water are added to a thoroughly cleansed 5-gallon Pyrex carboy. Next 180 milliliters of the cadmium fluoborate solution are added to this water and the mixture is diluted to 18 liters with more deionized water. These constituents are then mixed thoroughly by bubbling nitrogen gas through the solution for 10 minutes at a rate sufficient for good mixing. Preferably the gas should be cleansed by passage through a sintered glass filter before entering the solution.

After this mixing has been completed the pH of the solution is measured and its value adjusted to between about 2.1 and about 2.4. Where the pH is below about 2.1 it is raised by adding an appropriate amount of the ammonium hydroxide solution. Where it is above about 2.4 it is lowered by adding an appropriate amount of the fluoboric acid solution. After each addition of one of these pH-adjusting reagents, the solution is thoroughly mixed by bubbling the nitrogen gas therethrough for at least 10 minutes and the pH is then remeasured to determine whether the solution now has the proper pH. After its pH has been adjusted, the solution is filtered through paper into a clean 5-gallon polyethylene carboy. Just before using the solution to jet electroplate the cadmium disks, 2.5 milliliters of the sodium decylbenzenesulfonate solution are added thereto. Nitrogen gas is then bubbled through the plating solution for 5 minutes to mix the sodium decylbenzenesulfonate solution therewith.

To electroplate disks 22 and 24 onto surfaces 14 and 16 respectively of wafer 10, substantially coaxial jets of the plating solution are directed against these respective surfaces, and a potential difference exceeding the deposition potential of cadmium is applied between the jets and wafer 10 in a direction such as to pole wafer 10 negative with respective to the jets. As a result cadmium diks 22 and 24 are electrodeposited on surfaces 14 and 16 respectively.

Globule 28 of tin-cadmium-gallium alloy is affixed to an end of lead wire 26 by employing the process described and claimed in United States Patent No. 2,818,375. For this purpose an electrolytic solution prepared with the following constituents has been found satisfactory:

| | Grams |
|---|---|
| Glycerine, minimum assay 95 percent by volume of glycerol, A.C.S. reagent grade | 1600.0 |
| Stannous chloride, anhydrous | 176.0 |
| Cadmium chloride anhydrous powder, A.C.S. reagent grade | 42.0 |
| A homogeneous mixture of ammonium chlorogallate and ammonium chloride, anhydrous, assay as gallium trichloride, 60 percent by weight | 9.0 |
| Ammonium chloride, granular, A.C.S. reagent grade | 160.0 |

In preparing this solution, the above-listed salts, are added to the glycerine and the mixture stirred for about 35 minutes at room temperature. Thereafter, while undergoing vigorous stirring, the solution first is heated to a temperature of between about 135° C. and about 145° C. and is maintained thereat for ten minutes, and then is heated to a temperature of between about 158° C. and 162° C. and is maintained thereat for about 5 minutes. The solution then is cooled to about 120° C. and filtered under suction through a fritted glass filter. To reduce the surface tension of the filtrate and to reduce the grain size of the metal deposited therefrom, a surfactant is preferably added to the filtrate. This surfactant is a solution composed of 15 grams of dodecylbenzene sodium sulfonate, 35 milliliters of water and sufficient glycerol to make 100 milliliters of solution. 3.3 milliliters of this surfactant solution are added to the filtrate after its temperature falls to about 80° C., and the mixture is stirred slowly for about 5 minutes.

To plate globule 28 of tin-cadmium-gallium solder onto lead wire 26, a suitable quantity of the above-described solution is established at a temperature of between about 130 and 140° C., while dry argon or nitrogen gas is passed over the surface of the solution to prevent its acquiring moisture from the room atmosphere. About 0.5 mil of wire 26 is then immersed in the plating solution and a potential difference of about 13 volts is applied between wire 26 and an inert anode also immersed therein. Typically this anode is a rod composed of spectroscopically pure graphic Under these conditions globule 28 of a ternary alloy composed of about 15 to 20 percent by weight of cadmium, about 1.6 percent by weight of gallium and the remainder tin rapidly electrodeposits in molten form onto wire 26. For example an ellipsoidal globule weighing between about 15 and 20 micrograms and having a minor axis diameter of about seven mils deposits in about four seconds on a nickel wire having a diameter of 1.5 mils.

The potential difference is then removed and the plated wire 26 taken out of the plating solution.

Wire 26 is now ready to be bonded to wafer 10 by practicing the soldering and cooling steps already described above. Because the aforedescribed plating solution is relatively viscous at 140° C., a layer of it clings to globule 28 upon its removal therefrom. This layer serves as an excellent flux for the succeeding soldering step and hence no additional flux need be applied to globule 28 or disk 22 to achieve good soldering.

Similarly globule 36 of tin-cadmium solder is electroplated onto the end of lead wire 34 by using the process of Patent No. 2,818,375. For this purpose an electrolytic solution prepared with the following constituents has been found satisfactory:

| | Grams |
|---|---|
| Glycerine, minimum assay 95 percent by volume of glycerol, A.C.S. reagent grade | 1630.0 |
| Stannous chloride, anhydrous | 120.0 |
| Cadmium chloride, anhydrous, A.C.S. reagent grade | 83.2 |
| Ammonium chloride, granular, A.C.S. reagent grade | 163.0 |

The stannous chloride, cadmium chloride and ammonium chloride are added to the glycerine. The mixture is stirred for about 35 minutes at room temperature. Thereafter it is heated to a temperature of between about 135° C. and 145° C. and is maintained at this temperature for about 10 minutes while being stirred slowly. The resultant solution is then permitted to cool to about 120° C. and is filtered under suction through a sintered glass filter.

To plate globule 36 of tin-cadmium solder onto the end of lead wire 34, a suitable quantity of the above-described solution is established at a temperature of about 160° C. About a mil of wire 34 is immersed therein, and a potential difference of about 22 volts is applied between wire 34 and an inert (e.g. graphite) anode also immersed therein. Under these conditions globule 36, composed of about 65 percent by weight of tin and about 35 percent by weight of cadmium and melting at about 177° C., is electrodeposited in molten form onto wire 34. The plating is continued for about two seconds. Then the potential difference is removed and the plated wire is taken out of the bath.

After globule 36 has been plated onto wire 34, it is abutted against cadmium disk 24, and the heating and cooling steps already described are then performed. Again the layer of plating solution adherent to the globule serves as a soldering flux.

Figure 3:
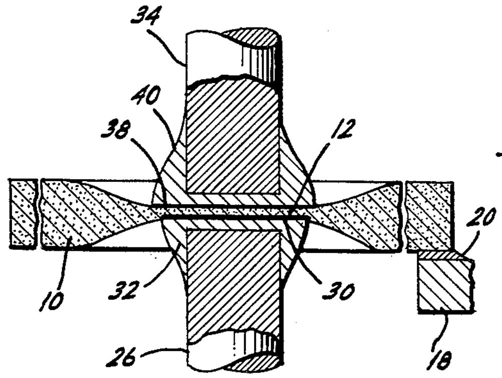

The transistor assembly shown in FIGURE 3 is now cleansed as follows:

First the assembly is rinsed in a hot (100° C.) solution consisting essentially of glacial acetic acid (3 percent by volume) dissolved in 1,2-propanediol. Next it is rinsed in deionized water maintained at 80° C. and then is rinsed in deionized water maintained at about 20° C. Thereafter two jets of a one molar aqueous solution of potassium hydroxide are respectively directed against fillets 32 and 40 and the portions of wafer 10 adjoining them. To cause electrolytic etching of the portions of wafer 10 impinged by the jets a potential difference is applied between lead wires 26 and 34 and platinum cathodes immersed in the jets, in a polarity such as to pole wires 26 and 34 and wafer 10 positive with respect to each jet. Preferably the jets are directed so as to intercept only a small portion of each lead wire in order that most of the electrolyzing current flows through the interface between wafer 10 and the jets rather than directly into the lead wires. Subsequent to this electrolytic etching the unit is again rinsed in deionized water. Thereafter it is vacuum-baked at a temperature of about 160° C. for about 2 hours. This baking temperature is above the melting point of indium (155° C.) and therefore considerably higher than the temperature at which transistors fabricated with indium can be baked without damage thereto. Because such higher baking temperatures can be used, the gases occluded in the surfaces of germanium wafer 10 as well as undesirable solvent materials present thereon and in fillets 32 and 40 are more readily decomposed and driven off, and a transistor having superior operating characteristics and a longer life is thereby obtained.

Figure 4:
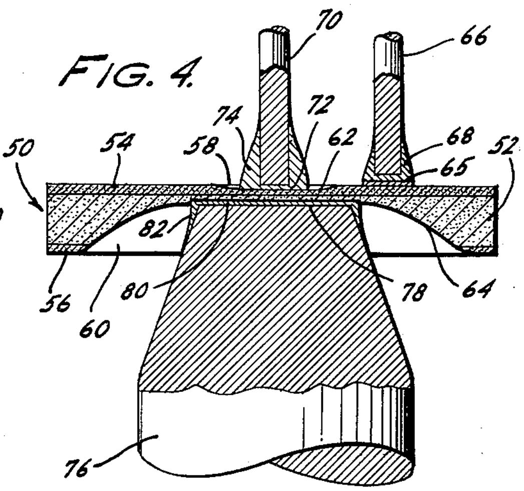
FIGURE 4 is a cross-sectional diagram of another transistor according to the invention.

Although the foregoing description relates to the structure and method of fabricating a novel microalloy transistor having a homogeneous, n-type semiconductive base region 12, the invention is not limited thereto. On the contrary, devices according to the invention may have a variety of specific structures and the process may have a variety of specific embodiments. In this regard FIGURE 4 shows a portion of a microalloy diffused-base power transistor according to the invention. The latter transistor comprises a wafer 50 composed of n-type germanium having a region 52 of high resistivity, e.g. 20 ohm-centimeters, and regions 54 and 56 of lower resistivity. More particularly, each of regions 54 and 56, which typically are prepared by diffusing an n-type dopant, e.g. vaporous arsenic, into the surfaces of the wafer, has a resistivity of only about 0.0005 ohm-centimeter at the external surfaces of the wafer. This resistivity increases in an approximately exponential manner at increasing distances below the surfaces of wafer 50 and finally becomes equal to the high resistivity of region 52 at about 0.1 mil below the surface thereof. A method for preparing such regions is described and claimed in the copending application of Richard A. Williams, Serial No. 669,852, filed July 3, 1957, now abandoned and entitled "Semiconductive Devices and Method for the Manufacture Thereof."

As shown in FIGURE 4, two opposing, substantially coaxial depressions 58 and 60 are jet-electrolytically etched into wafer 50. Depression 58 is shallow, its surface 62 lying entirely within region 54 of lower resistivity, while depression 60 is deep, its surface 64 cutting entirely through region 56 and well into region 52. In this regard, where a transistor capable of operating at high collector voltages is desired, the portion of surface 64 most closely approaching surface 62 and within which the collector junction is to be formed is fabricated to lie within high-resistivity region 52, as shown in FIGURE 4. Where a transistor operating at relatively low collector voltages is desired, the portion of surface 64 most closely approaching surface 62 is fabricated to lie within lower resistivity region 54. Preferably those portions of surfaces 62 and 64 within which the emitter and collector junctions respectively are to be formed are substantially plane and parallel to one another.

To provide a base connection to region 54 of wafer 50, a nickel disk 65 is affixed to region 54, e.g. by jet-electroplating, and a lead wire 66 is soldered to disk 65 with a cadmium-tin solder 68 containing about 35 percent by weight of cadmium.

A suitable solution for use in jet-electroplating nickel disk 65 consists of:

| | |
|---|---|
| Nickelous chloride ($NiCl_2.6H_2O$), A.C.S. reagent grade ________ grams __ | 20 |
| Boric acid, minimum assay 99.5 percent by weight, A.C.S. reagent grade ________ do ____ | 2 |
| Deionized water, to make 1 liter. | |
| An aqueous solution containing 15 percent by weight of sodium decylbenzene sulfonate ____ milliliter __ | 0.11 |

The pH of the foregoing solution is adjusted with concentrated ammonium hydroxide or concentrated hydrochloric acid to lie between 6.6 and 6.9.

Figure 2:
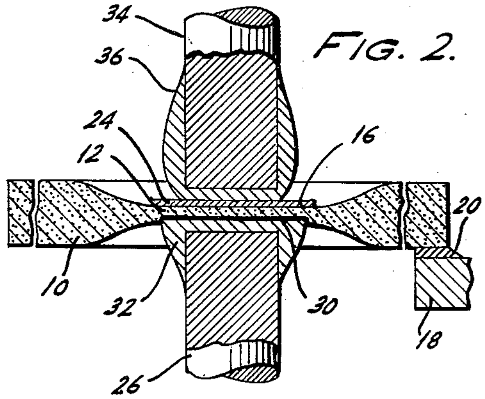

In accordance with the invention, emitter and collector junctions are formed in wafer 50 in the manner already described above with regard to the transistor assembly of FIGURES 1 to 3. In brief, cadmium disks (not shown) are jet-electroplated onto surfaces 62 and 64. The end of a wire 70 coated with a solder containing 15 to 20 percent by weight of cadmium, about 1.5 percent by weight of gallium and the remainder of tin is abutted against the cadmium disk plated on surface 62. This solder is then heated sufficiently to cause it, the cadmium disk and an extremely thin portion of region 54 lying therebeneath to form a liquid mixture, and this mixture is almost immediately thereafter cooled below its solidus temperature, thereby forming recrystallized region 72 and bonding lead wire 70 thereto by a solder fillet 74.

To form a collector junction and affix a relatively massive silver stud 76 to the recrystallized region associated with this junction the end 78 of silver stud 76 is coated with a solder consisting essentially of about 60 percent by weight of cadmium and about 40 percent by weight of tin. End 78 is then abutted against the cadmium disk plated onto surface 64 and the solder is heated to a temperature sufficient to cause it, the disk and a thin portion of region 52 therebeneath to form a liquid mixture. Upon cooling this mixture, a recrystallized region 80 containing cadmium as an acceptor impurity is formed and stud 76 is bonded thereto by solder fillet 82. Then the assembly is cleansed by electrolytically etching the portion of surface 64 adjoining solder fillet 82 with a jet of aqueous potassium hydroxide solution. Thereafter the metal stud is secured in intimate thermal contact with the metal casing (not shown) of the transistor.

During operation of the transistor, this casing serves to dissipate the heat developed at the collector junction and efficiently transmitted thereto by silver stud 76. Such heat-dissipative mountings for transistors are described and claimed in copending application Serial No. 733,613 of W. L. Doelp, Jr., and F. K. Clarke, filed May 7, 1958, now U.S. Patent No. 2,977,515 and entitled "Semiconductor Fabrication." Because the heat-conductive silver stud 76 is secured to wafer 52 by a tin-cadmium solder, heat is transferred to stud 76 much more efficiently than is possible in a device in which the silver stud is secured by an indium solder. Accordingly the power transistor of FIGURE 4 can be operated at higher power levels than can a transistor of the same dimensions which is however fabricated with an indium solder.

Figure 6:
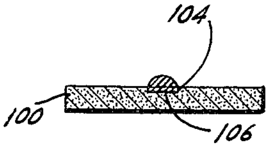
Figure 7:
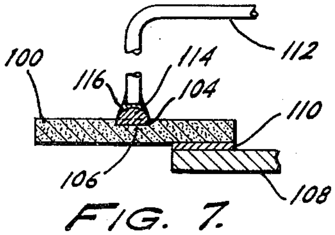

The method of the invention is not limited to the formation of rectifying junctions by alloying one of the aforedescribed solders with cadmium deposited on a germanium wafer, and a portion of the wafer underlying this cadmium. Alternatively a cadmium-germanium rectifying junction can be formed by plating cadmium onto the germanium body as aforedescribed and by heating the coated cadmium and the body above the melting point of cadmium (321° C.) thereby to alloy the disk with the body. As another alternative the junction can be formed by placing a pellet of cadmium or an alloy thereof, e.g. cadmium containing a small amount of gallium, aluminum, or gallium and aluminum, on the semiconductive body and by heating body and pellet above the melting point of cadmium thereby to alloy the pellet with the body. The latter process is now described in greater detail with regard to FIGURES 5, 6 and 7.

Figure 5:
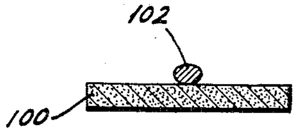
FIGURES 5 to 7 are cross-sectional diagrams of a diode according to the invention, at various stages in its fabrication.

In particular FIGURE 5 shows a wafer 100 of n-type germanium on one surface of which rests a pellet 102 of cadmium. Typically wafer 100 has a resistivity of about one ohm-centimeter. Because cadmium has relatively weak acceptor properties which are readily masked by the presence therein of donor dopants, the cadmium of pellet 102 should be of high purity, i.e. the total concentration of donor substances therein should be substantially less than that which would cause the recrystallized region formed by alloying pellet 102 into wafer 100 to be n-type. Where cadmium pellet 102 is composed of such pure cadmium a rectifying junction is readily formed within wafer 100 by alloying pellet 102 with the portion of wafer 100 lying therebeneath. This result is achieved by heating the wafer and pellet to a temperature (e.g. 350° C.) in excess of the melting point of the pellet (321° C.) and below the melting point of germanium (958.5° C.). Such heating is typically performed on a heating strip positioned beneath wafer 100 or in an alloying furnace of conventional form. Under these conditions pellet 102 and a portion of germanium wafer 100 lying therebeneath form a liquid mixture. The heating is continued for a time sufficient to permit enough germanium to dissolve into the molten cadmium adjacent wafer 100 so that, upon cooling the molten cadmium-germanium mixture below its solidus temperature, a recrystallized p-type region 104 forms in wafer 100 consisting of germanium doped with cadmium and having a p-n junction 106 (see FIGURE 6). To complete the diode, a base tab 108 composed of nickel is secured to the opposite surface of wafer 100 by a solder 110 which typically consists of tin or one of the aforementioned lead-arsenic or lead-antimony alloys. In addition a lead wire 112 is bonded to cadmium dot 114 by a solder fillet 116 composed for example of tin or tin and cadmium. Because the diode is fabricated with metals having melting points considerably higher than that of indium it is feasible to operate the diode at temperatures considerably above those at which indium-containing devices can be operated safely. Moreover because of the relatively high thermal conductivity of cadmium, these diodes can dissipate the heat generated therein more efficiently than can a diode of the same size utilizing indium as its alloying metal.

In the foregoing examples the solder used to form the microalloy emitter junction of each of the transistors described has been stated to be composed of between about 15 and 20 percent by weight of cadmium, about 1.5 percent by weight of gallium and the remainder tin, an alloy having a solidus temperature of about 170° C. However it is to be understood that the constituents of this solder need not necessarily be present in the foregoing proportions. For example all of the cadmium may be omitted from the solder. Under these conditions a solder is obtained containing about 98.5 percent by weight of tin and about 1.5 percent by weight of gallium and melting at about 230° C. Because this tin-gallium solder melts at a relatively high temperature, soldering therewith is facilitated by applying to the cadmium disk and the solder globule a flux consisting essentially of one part by weight of zinc chloride to one part by weight of water. By then heating the solder globule to a temperature above 230° C., a liquid mixture between the globule, the cadmium disk and a portion of the germanium wafer therebeneath is formed. By cooling this mixture below its solidus temperature almost immediately after it forms, an extremely thin recrystallized region rich in gallium is produced in the wafer which provides a rectifying junction having excellent hole-injection properties.

Moreover where desired, the acceptor dopant aluminum may be substituted for the gallium in any of the aforedescribed tin-gallium and tin-cadmium-gallium solders. Because aluminum has a greater solid solubility in germanium than gallium at typical soldering temperatures, e.g. about 300° C., the foregoing solders may contain less of this substance than of gallium. Thus to obtain junctions which inject holes efficiently, the aluminum concentration in a tin-aluminum or tin-cadmium-aluminum solder need only be between about 0.05 and about 0.2 percent by weight thereof, whereas the preferred range of gallium concentration in tin-gallium or tin-cadmium-gallium solders is between about 0.5 and about 1.6 percent by weight. Furthermore gallium and aluminum may be used concurrently as dopants in any of the aforedescribed tin or tin-cadmium solders. To maintain the solder mechanically strong, the gallium content thereof should not exceed about 1.6 percent by weight.

In addition any one of the foregoing solders can be used to form a collector junction as well as an emitter junction.

In the transistors of FIGURES 1 to 3 described above, the collector junctions are preferably formed by using a tin-cadmium solder containing about 35 percent by weight of cadmium and melting at about 177° C. This solder is employed because it contains somewhat less than the eutectic amount of cadmium and hence when melted tends rapidly to dissolve the cadmium disk therebeneath. Such rapid dissolution is desirable because it promotes rapid formation of the liquid mixture between the solder, disk and germanium portion therebeneath. However cadmium-tin solders having proportions differing from the foregoing can also be used. Thus where enhanced heat conductivity of the rectifier electrode is desired, this may be achieved by increasing the amount of cadmium in the solder above 35 percent, e.g. 60 percent of cadmium as used in fillet 82 (see FIGURE 4). Furthermore the collector junction can be formed by alloying pure cadmium into the semiconductor body. Alternatively a cadmium surface-barrier contact can be substituted for the alloy-junction collector contact of the invention.

Where electrodes melting at temperatures even higher than the eutectic temperature of tin-cadmium alloys are desired, other metals and alloys may be employed as solders. Examples of these other solders are the cadmium-lead alloy, whose eutectic contains 82.6 percent by weight of lead and melts at 248° C., the cadmium-zinc alloy, whose eutectic contains 17.4 percent by weight of cadmium and melts at 266° C., the cadmium-thallium alloy, whose eutectic contains 82.9 percent by weight of thallium and melts at 203.5° C., pure thallium melting at 303.6° C., and the cadmium-gold alloy, whose lowest-melting eutectic contains 87 percent cadmium and melts at 309° C. In addition each of the foregoing solders may contain the dopants gallium and/or aluminum.

In each of the foregoing examples a solder globule has been electroplated onto a wire lead prior to soldering. While this method has proved in practice to be well adapted for use on an automated assembly line and therefore is preferred, it is to be understood that the globules may instead be separately prepared by non-electrolytic processes, e.g. by melting together appropriate amounts of the solder metals in a crucible and thereafter by forming alloy pellets of appropriate size from this melt. Then each pellet may be affixed to a lead wire by warming the pellet to its softening temperature and by thrusting an end of the wire into it. Alternatively an uncoated lead wire may be abutted against the cadmium disk and the appropriate solder introduced between disk and wire in any other manner desired.

Moreover in each of the foregoing examples the germanium body has been designated as n-type. However, alloy-junction rectifying electrodes of the abovedescribed type can also be formed readily in intrinsic germanium. Moreover electrodes having substantially ohmic properties can be formed on a p-type germanium body by practicing any of the aforedescribed processes according to the invention. In addition an n-type recrystallized region providing a rectifying junction can be formed in a body composed of p-type germanium by employing as the alloying material a cadmium alloy having a solidus temperature above 155° C. and containing a sufficient amount of a donor substance to more than compensate for the acceptor properties of cadmium and other acceptor metals which may be present in the alloy. For example this alloying material may be an alloy of cadmium and antimony containing between about 2 and about 5 percent by weight of antimony and having a eutectic temperature of about 290° C., or the eutectic alloy of cadmium and arsensic, containing about 0.3 percent by weight of arsenic and melting at about 320° C. The latter two alloys can also be used to form contacts having substantially ohmic properties on n-type germanium. Alternatively the arsenic or antimony can be added as a dopant to any of the aforedescribed tin-cadmium, lead-cadmium, thallium-cadmium, zinc-cadmium or gold-cadmium alloys.

While I have described by invention by means of specific examples and in specific embodiments, I do not wish to be limited thereto for obvious modifications will occur to those skilled in the art without departing from the scope of my invention.

What I claim is:

1. A semiconductor device comprising an n-type semiconductor body and a p-type alloy region integral with said body, said body consisting essentially of n-type monocrystalline germanium and said alloy region consisting essentially of germanium and a material selected from the class consisting of (a) cadmium, (b) cadmium and gallium,
(c) cadmium and aluminum,
(d) cadmium, gallium and aluminum,
(e) cadmium and an element selected from the group consisting of tin, lead, zinc, thallium and gold, and
(f) cadmium, an element selected from the group consisting of tin, lead, zinc, thallium and gold, and a metal selected from the group consisting of gallium and aluminum.

2. A transistor comprising a body of n-type germanium providing a base region, an alloy region on one side of said body and integral therewith providing a p-type emitter region, and a second alloy region on the opposing side of said body and also integral therewith providing a p-type collector region, each of said alloy regions consisting essentially of germanium and a material selected from the class consisting of (e) cadmium,
(b) cadmium and gallium,
(c) cadmium and aluminum,
(d) cadmium, gallium and aluminum,
(e) cadmium and an element selected from the group consisting of tin, lead, zinc, thallium and gold, and
(f) cadmium, an element selected from the group consisting of tin, lead, zinc, thallium and gold, and a metal selected from the group consisting of gallium and aluminum.

3. A transistor according to claim 2, wherein said alloy region providing said collector region is a microalloy region consisting essentially of germanium, cadmium and tin.

4. A transistor according to claim 2, wherein said alloy region providing said emitter region is constituted of an alloy consisting essentially of germanium, cadmium, tin and gallium.

5. A transistor according to claim 2, wherein said alloy region providing said collector region is constituted of an alloy consisting essentially of germanium, cadmium and tin.

6. A transistor according to claim 5, wherein said alloy region providing said emitter region is constituted of an alloy consisting essentially of germanium, cadmium, tin and gallium.

7. A transistor according to claim 2, wherein both of said alloy regions are constituted of an alloy consisting essentially of germanium, cadmium, tin and gallium.

8. A transistor according to claim 2, wherein at least one of said emitter and collector regions is composed of an alloy consisting essentially of germanium and cadmium.

References Cited by the Examiner

UNITED STATES PATENTS

| | | | |
|---|---|---|---|
| 2,496,692 | 2/50 | Blackburn ---------- | 75—151 X |
| 2,742,383 | 4/56 | Barnes et al. --------- | 148—33.2 |

OTHER REFERENCES

J. Phys. Chem. Solids, vol. 8, pages 59–65, January 1959.

Bull. Am. Physical Soc., vol. 1, page 127, 1956.

DAVID L. RECK, *Primary Examiner.*

RAY K. WINDHAM, *Examiner.*